(12) United States Patent
Kang et al.

(10) Patent No.: US 10,883,164 B2
(45) Date of Patent: Jan. 5, 2021

(54) MASK FRAME ASSEMBLY INCLUDING PATTERN POSITION ADJUSTING MECHANISM AND PATTERN POSITION ADJUSTING METHOD USING THE MASK FRAME ASSEMBLY

(71) Applicant: Samsung Display Co., Ltd., Yongin-si (KR)

(72) Inventors: Mingoo Kang, Yongin-si (KR); Jongbum Kim, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 729 days.

(21) Appl. No.: 15/632,453

(22) Filed: Jun. 26, 2017

(65) Prior Publication Data

US 2018/0023183 A1     Jan. 25, 2018

(30) Foreign Application Priority Data

Jul. 19, 2016    (KR) .......................... 10-2016-0091435

(51) Int. Cl.
    *C23C 14/04*          (2006.01)
    *H01L 51/00*          (2006.01)
    (Continued)

(52) U.S. Cl.
    CPC ............ *C23C 14/042* (2013.01); *C23C 14/04* (2013.01); *C23C 16/04* (2013.01); *C23C 16/042* (2013.01);
    (Continued)

(58) Field of Classification Search
CPC ..... C23C 4/0005; C23C 14/04; C23C 14/042; C23C 14/044; C23C 16/04; C23C 16/042; C23C 8/04; C23C 10/04; C23C 14/046; C23C 14/048; C23C 16/045; C23C 16/047; C23C 18/06; C23C 18/1603; C23C 18/1605; C23C 18/1607; C30B 25/04; H01J 1/52; H01J 1/53; H01J 1/54; H01J 1/56; H01J 1/58; H01J 1/60; H01J 1/62; H01J 2229/07; H01J 2229/0705; H01J 2229/0711; H01J 2229/0716;
(Continued)

(56) References Cited

U.S. PATENT DOCUMENTS 2,265,786 A * 12/1941 White, Jr. ................. G01L 5/04
                                                   73/862.41
2,890,734 A * 6/1959 Mullin ..................... F16B 39/20
                                                    411/87
(Continued)

FOREIGN PATENT DOCUMENTS

| JP | 2003332056 A * 11/2003 |
|---|---|
| JP | 4784145 B2     7/2011 |

(Continued)

*Primary Examiner* — Aiden Lee
(74) *Attorney, Agent, or Firm* — Cantor Colburn LLP (57) ABSTRACT

A mask frame assembly includes: a mask including a deposition pattern through which a deposition material is deposited to a deposition target; a frame to which the mask comprising the deposition pattern is combined; and a pattern position adjusting mechanism which is coupled to the frame and configured to apply a force to the frame such that a position of the deposition pattern of the mask combined to the frame is changed.

6 Claims, 7 Drawing Sheets

(51) Int. Cl.
*H05K 3/14* (2006.01)
*C23C 16/04* (2006.01)

(52) U.S. Cl.
CPC .......... *H01L 51/0011* (2013.01); *H05K 3/146* (2013.01); *H05K 2201/10128* (2013.01); *H05K 2203/0169* (2013.01)

(58) Field of Classification Search
CPC ....... H01J 2229/0722; H01J 2229/0727; H01J 2229/0733; H01J 2229/0738; H01J 2229/0744; H01J 2229/075; H01J 2229/0755; H01J 2229/0761; H01J 2229/0766; H01J 2229/0772; H01J 2229/0777; H01J 2229/0783; H01J 2229/0788; H01J 2229/0794; H01J 2229/8633; H01J 2229/8637; H01J 2229/8638; H01J 2229/8909; H01J 2229/8911; H01J 2237/026; H01J 2237/0262; H01J 2237/0264; H01J 2237/0266; H01J 2237/31718; H01J 2237/3172; H01J 2237/31723; H01J 2237/31727; H01J 2237/31728; H01J 2237/31761; H01J 2237/21762; H01J 2237/31764; H01J 2237/31766; H01J 2237/31767; H01J 2237/31794; H01J 29/06; H01J 29/07; H01J 29/073; H01J 29/076; H01J 29/08; H01J 29/10; H01J 29/12; H01J 29/14; H01J 29/16; H01J 29/18; H01J 29/182; H01J 29/185; H01J 29/187; H01J 31/08; H01J 31/16; H01J 31/18; H01J 31/20; H01J 31/22; H01J 31/24; H01J 31/40; H01J 31/42; H01J 31/52; H01J 31/54; H01J 37/32654; G01L 5/04
USPC .................................................. 118/720–721
See application file for complete search history.

(56) References Cited

U.S. PATENT DOCUMENTS

| | | | | |
|---|---|---|---|---|
| 3,806,992 A * | 4/1974 | Reimer | .................. | H02G 11/02 242/378.3 |
| 3,943,612 A * | 3/1976 | Campbell | .............. | D06C 3/028 26/76 |
| 5,116,178 A * | 5/1992 | Lerman | .................... | F16B 39/20 403/316 |
| 5,162,008 A * | 11/1992 | Steiner | .................... | H01J 29/073 101/127.1 |
| 5,534,969 A * | 7/1996 | Miyake | .................... | G03F 7/707 250/559.3 |
| 2003/0101932 A1* | 6/2003 | Kang | .................... | C23C 14/042 118/504 |
| 2003/0150384 A1* | 8/2003 | Baude | ................. | H01L 51/0011 118/721 |
| 2003/0201711 A1* | 10/2003 | Abiko | ................... | H01L 51/001 313/504 |
| 2004/0163592 A1* | 8/2004 | Abiko | ................... | C23C 14/042 118/715 |
| 2006/0213442 A1* | 9/2006 | Park | ...................... | C23C 14/042 118/720 |
| 2007/0163494 A1* | 7/2007 | Tokie | .................... | C23C 16/545 118/301 |
| 2009/0127236 A1* | 5/2009 | Hong | ....................... | G03F 7/12 219/121.64 |
| 2009/0311427 A1* | 12/2009 | Marcanio | ............. | H05K 3/1225 427/282 |
| 2010/0330265 A1* | 12/2010 | Lee | ......................... | C23C 14/12 427/66 |
| 2012/0240850 A1 | 9/2012 | Kobayashi et al. | | |
| 2015/0007767 A1* | 1/2015 | Ko | .......................... | B05B 12/29 118/504 |
| 2015/0026947 A1* | 1/2015 | Han | ...................... | B05C 21/005 29/428 |
| 2015/0050767 A1* | 2/2015 | Kuriyama | ............. | C23C 14/042 438/34 |
| 2016/0043319 A1* | 2/2016 | White | .................... | G02B 26/02 359/230 |
| 2016/0201185 A1* | 7/2016 | Bai | ....................... | C23C 14/042 118/720 |

FOREIGN PATENT DOCUMENTS

| | | | | |
|---|---|---|---|---|
| KR | 1020040075285 | 8/2004 | | |
| KR | 1020100119675 | 11/2010 | | |
| KR | 1020120108495 | 10/2012 | | |
| KR | 1020150086126 | 7/2015 | | |
| WO | WO-2011132325 A1 * | 10/2011 | ........ | H01J 37/32091 |

\* cited by examiner

MASK FRAME ASSEMBLY INCLUDING PATTERN POSITION ADJUSTING MECHANISM AND PATTERN POSITION ADJUSTING METHOD USING THE MASK FRAME ASSEMBLY

This application claims priority to Korean Patent Application No. 10-2016-0091435, filed on Jul. 19, 2016, and all the benefits accruing therefrom under 35 U.S.C. § 119, the content of which in its entirety is herein incorporated by reference.

BACKGROUND

1. Field

One or more embodiments relate to mask frame assembly used to deposit a material for forming a thin film, and more particularly, to a mask frame assembly including a mechanism for adjusting a position of a pattern for deposition, and a pattern position-adjusting method using the mask frame assembly.

2. Description of the Related Art

Generally, an organic light-emitting display apparatus realizes a color by using a principle in which holes and electrons respectively injected from an anode and a cathode combine in an emission layer to emit light. In the organic light-emitting display apparatus, pixels have a stacked structure in which the emission layer is inserted between the anode that is otherwise referred to as a pixel electrode and the cathode that is otherwise referred to as a counter electrode.

Each pixel may include, for example, a red sub-pixel, a green sub-pixel and a blue sub-pixel, and a desired color of the overall pixel as a unit may be realized by a color combination of the red, green and blue sub-pixels. In other words, each sub-pixel has a structure in which an emission layer emitting any one of red light, green light and blue light, is disposed between two electrodes, and a color of a unit pixel is realized by a suitable combination of the red, green and blue lights.

The anode, the cathode and the emission layer of the organic light-emitting display apparatus may be formed in a thin film by a deposition method. Within the deposition method, a mask frame assembly having the same pattern as a desired pattern of a thin film to be formed is aligned on a substrate on which the thin film is to be formed. With such alignment, a raw material for forming the thin film is deposited on the substrate through the mask frame assembly, thereby forming the thin film having the desired pattern.

SUMMARY

One or more embodiments include a mask frame assembly capable of adjusting a deposition pattern position of the mask frame assembly if necessary, and a pattern position adjusting method using the mask frame assembly.

Additional features will be set forth in part in the description which follows and, in part, will be apparent from the description, or may be learned by practice of the presented embodiments.

According to one or more embodiments, a mask frame assembly includes: a mask including a deposition pattern through which a deposition material is deposited to a deposition target; a frame to which the mask including the deposition pattern is combined; and a pattern position adjusting mechanism which is coupled to the frame and configured to apply a force to the frame such that a position of the deposition pattern of the mask combined to the frame is changed.

The pattern position adjusting mechanism may include: a plurality of rotors provided along an edge of the frame; and a wire which connects more than one of the rotor to each other and applies the force to the frame according to rotation of the rotor.

Each of the plurality of rotors may include: a winch bolt rotatably combined to the frame and to which the wire is connected; and an adjusting bolt integrally combined to the winch bolt and with which rotation of the winch bolt is manipulable.

The winch bolt may be provided on an outer surface of the edge of the frame.

An outer circumference surface of the adjusting bolt may be a polyhedron.

The wire may be provided in singularity commonly connected to all of the plurality of rotors and surrounding the edge of the frame.

The wire may be provided in plurality each connecting more than one of the rotor to each other, the plurality of wires collectively disposed to surround the edge of the frame.

The mask frame assembly may further include an elongated support combined to the frame and overlapping the deposition pattern of the mask, where the elongated support divides the deposition pattern of the mask into more than one of a unit cell pattern.

The mask may cross the elongated support at a right angle.

According to one or more embodiments, a deposition pattern position adjusting method of a mask frame assembly includes: preparing the mask frame assembly including: a mask including a deposition pattern through which a deposition material is deposited to a deposition target, a frame to which the mask including the deposition pattern is combined, a plurality of rotors provided along an edge of the frame, and a wire which connects more than one rotor among the plurality of rotors to each other; determining a location at which a position of the deposition pattern of the mask is to be adjusted and changing tension of the wire by rotating, from among the more than one rotor, a rotor which affects adjustment of the position of the deposition pattern at the determined location.

Each of the plurality of rotors may include: a winch bolt rotatably combined to the frame and to which the wire is connected; and an adjusting bolt integrally combined to the winch bolt and with which rotation of the winch bolt is affected to change the tension of the wire connected to the winch bolt.

The winch bolt may be provided on an outer surface of the edge of the frame.

An outer circumference surface of the adjusting bolt may be a polyhedron.

The wire may be provided in singularity commonly connected to all of the plurality of rotors and surrounding the edge of the frame.

The wire may be provided in plurality each connecting more than one rotor to each other, the plurality of wires collectively disposed to surround the edge of the frame.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Reference will now be made in detail to embodiments, examples of which are illustrated in the accompanying drawings. In this regard, the embodiments may have different forms and should not be construed as being limited to the descriptions set forth herein. Accordingly, the embodiments are merely described below, by referring to the figures, to explain features of the present description.

In drawings, like reference numerals refer to like elements throughout and overlapping descriptions shall not be repeated.

In describing relationships between elements such as being "on," "connected to," "between," etc., it will be understood that an element can be directly related to another element or intervening elements may be present therebetween. In contrast, when an element is referred to as being "directly" related to another element, there are no intervening elements present.

As used herein, the singular forms "a," "an" and "the" are intended to include the plural forms as well, unless the context clearly indicates otherwise.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will be further understood that the terms "comprises" and/or "comprising" used herein specify the presence of stated features or components, but do not preclude the presence or addition of one or more other features or components.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

When a certain embodiment may be implemented differently, a specific process order may be performed differently from the described order. For example, two consecutively described processes may be performed substantially at the same time or performed in an order opposite to the described order.

A mask frame assembly through which a raw material is deposited to a substrate or the substrate (otherwise referred to as a deposition target) on which a thin film is formed from the raw material may be deformed according to contraction or expansion thereof. With such contraction or expansion of, accurately forming a deposition pattern at a desired location on the substrate by using the mask frame assembly may be difficult. Therefore an improved mask frame assembly for which a position of a deposition pattern of a mask used to apply the raw material to the substrate is changeable, is desired.

Figure 1:
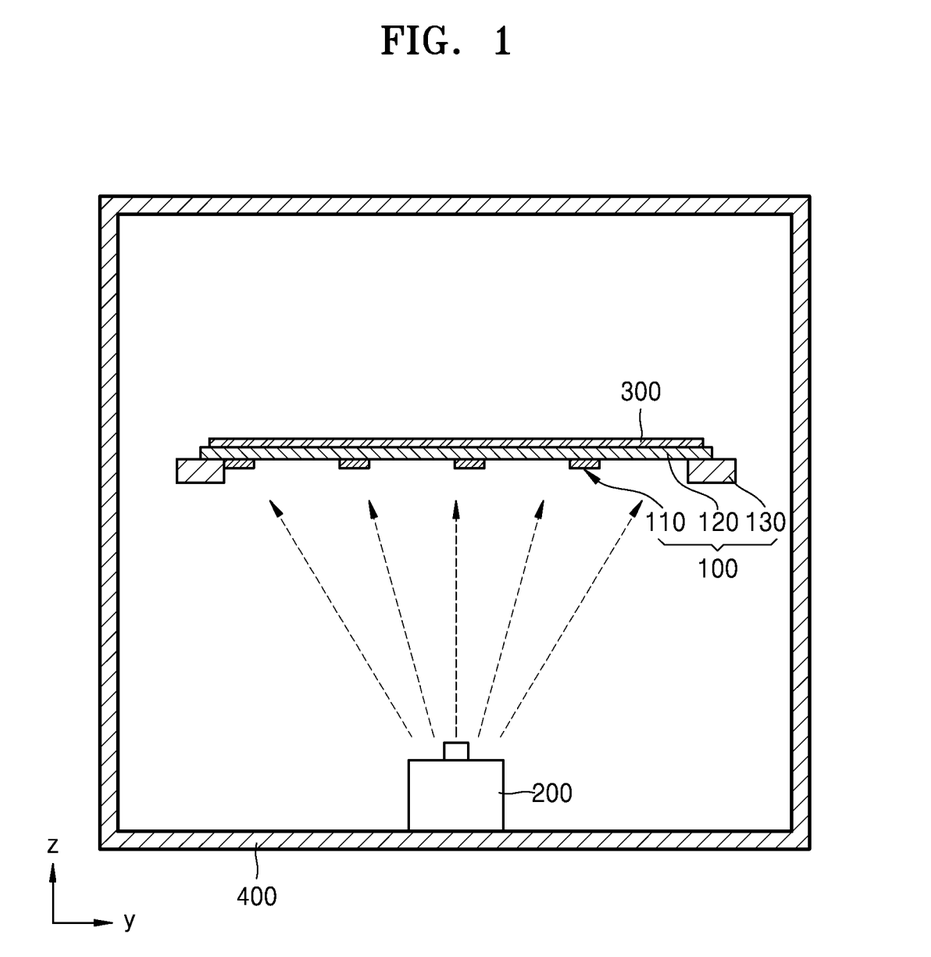
FIG. 1 is a cross-sectional view of a thin film deposition apparatus for describing a deposition process using an embodiment of a mask frame assembly, according to the invention.

FIG. 1 is a cross-sectional view of a thin film deposition apparatus employing an embodiment of a mask frame assembly 100, according to the invention.

As shown in FIG. 1, the thin film deposition apparatus include a chamber 400 in which a deposition process is performed and a deposition source 200 which provides a deposition gas. The mask frame assembly 100 for forming a desired thin film pattern on a substrate 300 as a deposition target, and the deposition source 200 from which a deposition gas is ejected towards the substrate 300 are disposed in the chamber 400.

Accordingly, when the deposition source 200 ejects the deposition gas in the chamber 400, the deposition gas is deposited on the substrate 300 through the mask frame assembly 100, thereby forming a thin film having a certain pattern on a surface of the substrate 300.

Figure 2:
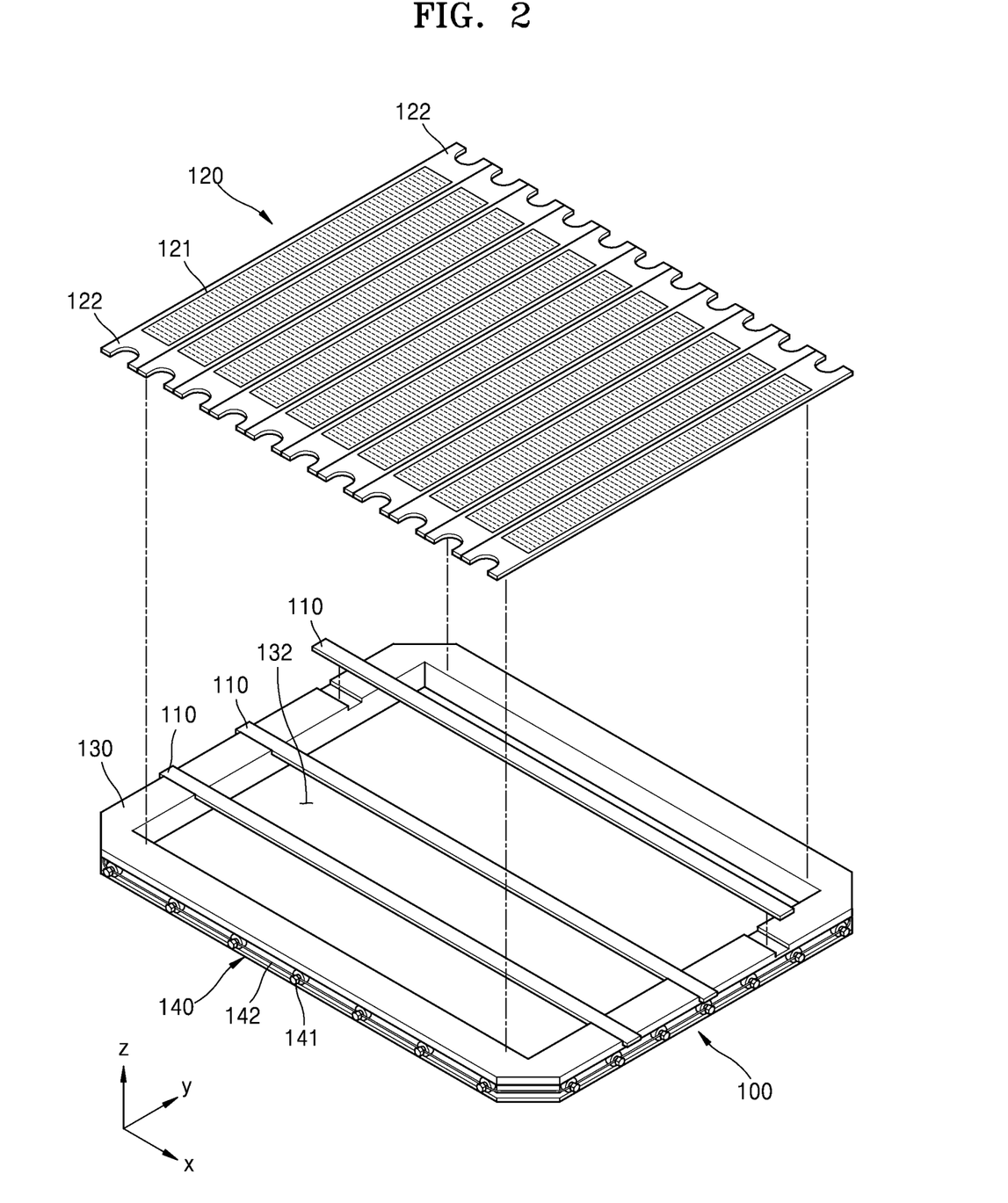
FIG. 2 is an exploded perspective view of an embodiment of the mask frame assembly of FIG. 1.

Here, the mask frame assembly 100 has a structure in which a mask 120, a frame 130, and an elongated support (e.g., having a stick or bar shape) 110 are combined, as shown in FIG. 2.

Referring to FIG. 2, the mask frame assembly 100 according to the embodiment includes the frame 130, the elongated support 110 provided in plurality each having two ends opposing each other and fixed to the frame 130, and a mask 120 provided in plurality crossing the plurality of elongated supports 110 such as at right angles and having two ends opposing each other and fixed to the frame 130.

The frame 130 forms an outer frame-shape of the mask frame assembly 100, and has an overall rectangular shape in the top plan view having an opening 132 at the center area thereof. The frame 130 may be disposed in a plane defined by a (first) x-direction and a (second) y-direction. A thickness (third) direction may be defined in a z-direction crossing each of the first and second directions. In the x-y plane, the frame 130 includes two pairs of sides which oppose each other. A first pair of sides lengthwise extend in the y-direction and a second pair of sides lengthwise extend in the x-direction.

In the top plan view (e.g., the x-y plane), each elongated support 110 defines a length thereof which is greater than a width thereof. Referring to FIG. 2, the length of the elongated support 110 extends in the x-direction, while the width extends in the y-direction. In a length extension direction, two ends of the elongated support 110 oppose each other and are respectively fixed to two first sides of the frame 130, which face each other. The elongated support 100 may be fixed to the frame 130 by welding.

In the top plan view (e.g., the x-y plane), each mask 120 defines a length thereof which is greater than a width thereof. Referring to FIG. 2, the length of the mask 120 extends in the y-direction, while the width extends in the x-direction. In a length extension direction, two ends of the mask 120 oppose each other and are respectively fixed to two second sides of the frame 130, which face each other. The mask 120 may be fixed to the frame 130 by welding. In an embodiment, the second two sides are lengthwise extended perpendicular to a length extension direction of the first two sides that are fixed to the elongated support 110.

The masks 120 are members each having an elongated stick shape similar to the elongated supports 110. An individual mask 120 has a pattern 121 provided in plurality in the opening 132, and has two opposing ends welded to the frame 130 as described above. The mask 120 is defined by solid portions thereof and non-solid portions thereof at which openings are formed through a thickness of the mask 120.

As a solid portion of the mask 120, reference numeral 122 denotes a clamping portion of the mask at the opposing ends of the mask 120. In an embodiment of attaching the mask 120 to the frame 130, when the mask 120 is to be welded to the frame 130, an un-stretched mask 120 is elongated (e.g., stretched) in a length direction thereof to have a length greater than that of the un-stretched mask 120. For the stretched mask 120, while the clamping portion 122 thereof is held in a fixed position on the frame 130 the clamping portion 122 is welded to the frame 120 and excess length of the mask 120 at the clamping portion 122 is cut and removed after the welding. Each of the individual masks 120 may be a relatively large single member, but may droop due to a weight thereof to be disposed out of the plane of the frame 130. Thus, the plurality of masks 120 each having the stick shapes are combined with each other as shown in FIG. 2. The masks 120 may be formed of, for example, nickel (Ni) or a nickel-cobalt alloy.

As a non-solid portion of the mask 120, the pattern 121 is a region in which a plurality of pattern holes are formed through which a material for forming a thin film passes. The area of the pattern 121 including the plurality of pattern holes may also be referred to as a mesh portion. In an embodiment of a deposition process, a thin film layer is formed on the substrate 300 as deposition vapor (e.g., deposition material) passes through the pattern holes during the deposition process.

Within one mask 120, the pattern 121 is not divided into unit cell patterns (e.g., mesh portions) separated by a solid portion of the mask 120, but is disposed in one singular elongated shaped area. The singular elongated pattern 121 is effectively partitioned into unit cell patterns by the elongated supports 110. In other words, as shown in FIG. 2, the mask 120 and the elongated support 110 are closely provided to each other in a thickness direction while crossing the frame 130 at right angles to each other in the plane view. Accordingly, the elongated support 110 crosses the singular elongated pattern 121 of the mask 120 to effectively partition the singular elongated pattern 121 into unit cell patterns in the plan view. In other words, the elongated support 110 defines a border line or boundary area between the unit cell patterns of the mask 120.

After the frame 130, the elongated support 110 and the mask 120 are initially assembled with each other, a position of the pattern 121 may need to be adjusted. In other words, as described above, an initial position of the pattern 121 of the mask and a desired thin film forming area of the substrate 300 may be misaligned due to contraction or expansion of the substrate 300 and/or the mask frame assembly 100. The location of the misalignment may determine the location at which a position of the pattern 121 is to be adjusted. Thus in order to reduce or effectively prevent a deposition defect, the position of the pattern 121 may need to be minutely adjusted after the assembling is initially completed.

Accordingly, the mask frame assembly 100 according to one or more embodiment includes a pattern position adjusting mechanism 140 including a rotor 141 and a wire 142, as shown in FIG. 2. The rotor 141 is provided in plurality at regular intervals at an outer (side) surface of the frame 130 along an outer edge of the frame 130. The wire 142 is disposed at the outer (side) surface of the frame 130 to surround the frame 130 and connects the rotors 141 to each other.

A structure of the pattern position adjusting mechanism 140 will now be described with reference to FIGS. 3 through 5.

Figure 3:
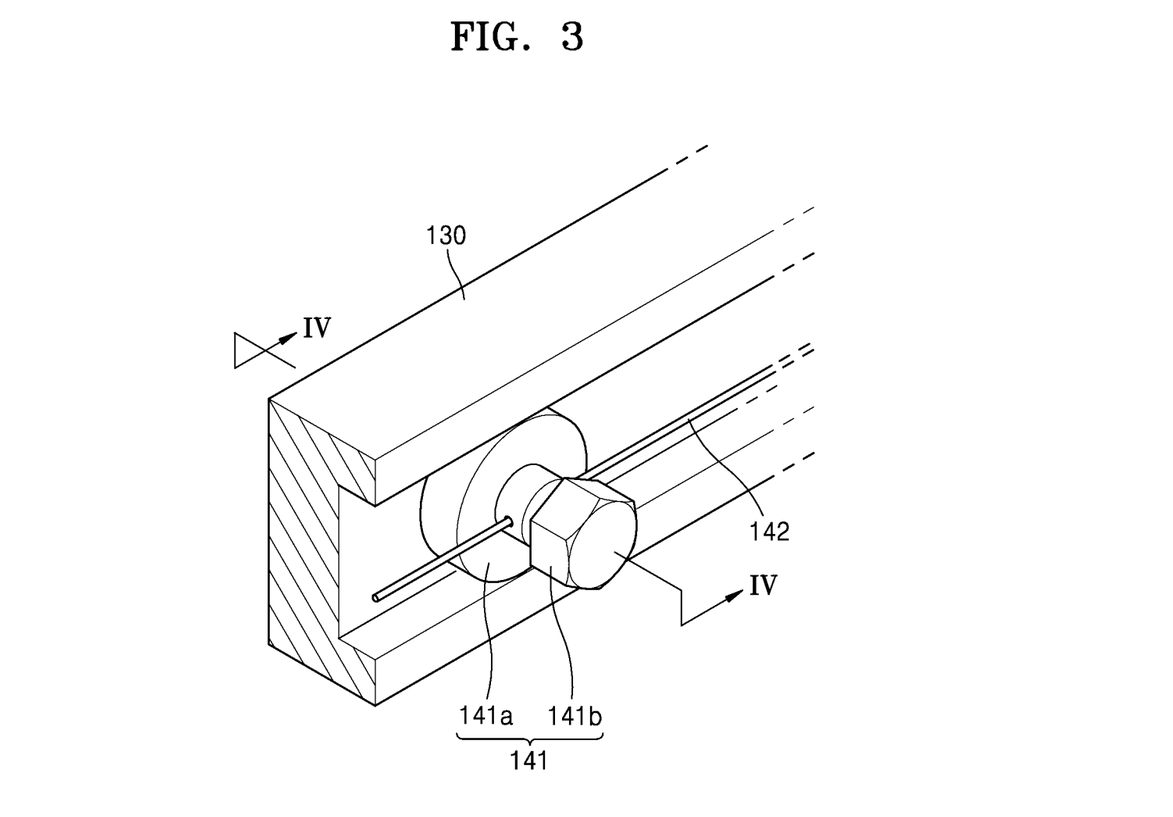
FIG. 3 is an enlarged perspective view of an embodiment of a pattern position adjusting mechanism of the mask frame assembly of FIG. 2.
Figure 4:
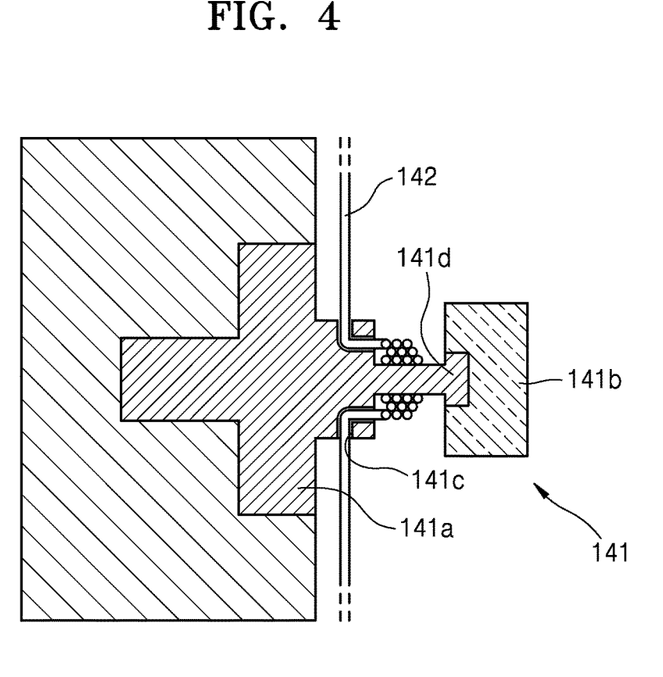
FIG. 4 is a cross-sectional view of the pattern position adjusting mechanism taken along line IV-IV of FIG. 3.

First, as shown in FIGS. 3 and 4, the rotor 141 includes a winch bolt 141a rotatably combined to the outer surface of the frame 130 and to which the wire 142 is connected, and an adjusting bolt 141b integrally combined to the winch bolt 141a. Accordingly, when the adjusting bolt 141b is rotated, the winch bolt 141a is also rotated, and thus tension of the wire 142 connected to the winch bolt 141a is changed. An outer circumference surface of the adjusting bolt may be polyhedron in shape.

As shown in FIG. 4, the wire 142 enters a through hole 141c at a first side of the winch bolt 141a, is wound a number of times around a connection portion 141d of the winch bolt 141a connected with the adjusting bolt 141b, and then exits through a through hole 141c at a second side of the winch bolt 141a opposite to the first side thereof. As such, the wire 142 sequentially connects the winch bolts 141a of the rotors 141 to each other while surrounding the outer edge of the frame 130. In other words, one single wire 142 that is disposed a single body connects all of the winch bolts 141a of the rotors 141 which are provided along the outer edge of the frame 130, as shown in FIG. 4 taken with FIG. 2.

Figure 5:
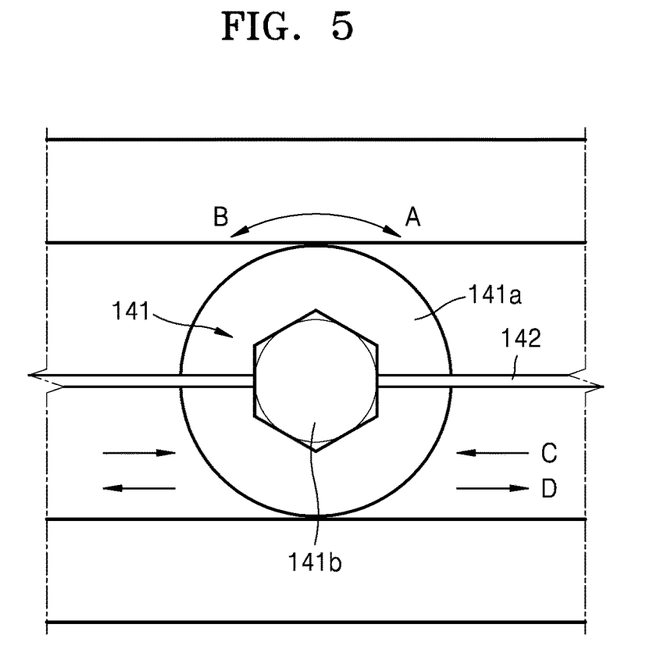
FIG. 5 is a front plan view showing an embodiment of a tension change according to rotation of the pattern position adjusting mechanism of FIG. 3.

When the adjusting bolt 141b of any one of the rotors 141 is rotated such that the one rotor 141 is rotated in a clockwise direction A as shown in FIG. 5, the wire 142 is further wound around the winch bolt 141a such that portions of the wire 142 at the first and second sides (e.g., left and right) of the rotor 141 are moved in a direction indicated by an arrow C, and thus left and right tension of the wire 142 is increased.

Conversely, when the adjusting bolt 141b is rotated such that the one rotor 141 is rotated in a counterclockwise direction B, the wire 142 is unwound from the winch bolt 141a such that portions of the wire 142 at the left and right sides of the rotor 141 are moved in a direction indicated by an arrow D, and thus left and right tension of the wire 142 is decreased.

As such, when tension of the wire 142 is changed, clamping force a position of side portions of the frame 130 in a plane direction towards the center of the opening 132 of the frame 130 is changed, and thus the position of the pattern 121 fixed to the frame 130 may be minutely adjusted.

A pattern position adjusting method using the pattern position adjusting mechanism 140 will be described in detail later, and an example of a deposition target using the mask frame assembly 100 will now be briefly described.

The mask frame assembly 100 may be used to deposit various thin films, and for example, may be used to form a pattern of an emission layer of an organic light-emitting display apparatus.

Figure 7:
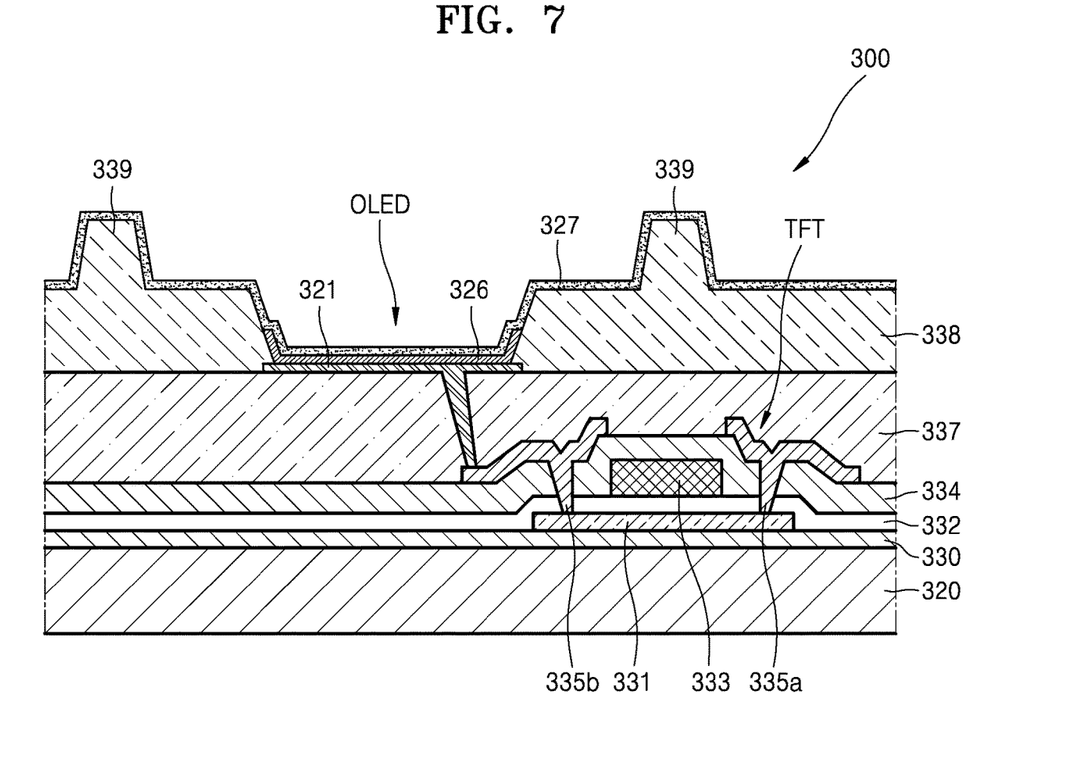
FIG. 7 is an enlarged cross-sectional view of a detailed structure of an embodiment of a substrate of FIG. 1.

FIG. 7 is an enlarged cross-sectional view of a structure of an embodiment of an organic light-emitting display apparatus as an example of the substrate 300 (refer to FIG. 1) on which a thin film may be deposited by using one or more embodiment of the mask frame assembly 100, according to the invention.

Referring to FIG. 7, a buffer layer 330 is disposed or formed on a base plate 320, and a thin-film transistor TFT is provided above the buffer layer 330.

The thin-film transistor TFT includes an active layer 331, a gate insulating layer 332 covering the active layer 331, and a gate electrode 333 over the gate insulating layer 332.

An interlayer insulating layer 334 is provided to cover the gate electrode 333, and a source electrode 335a and a drain electrode 335b are provided above the interlayer insulating layer 334.

The source electrode 335a and the drain electrode 335b respectively contact a source region and a drain region of the active layer 331 through contact holes provided in the gate insulating layer 332 and the interlayer insulating layer 334.

Also, the drain electrode 335b is connected to a pixel electrode 321 of an organic light-emitting device OLED. The pixel electrode 321 is disposed or formed over a planarization layer 337, and a pixel-defining layer 338 defining a sub-pixel region of a pixel is disposed or formed over the pixel electrode 321. Portions of the pixel-defining layer 338 define an opening at which the organic light-emitting device OLED is disposed. A reference numeral 339 denotes a spacer for reducing or effectively preventing damage to layers or elements on the base plate 320 of substrate 300 from contact with the mask frame assembly 110, by maintaining an interval or gap between the substrate 300 and the mask frame assembly 100. The spacer 339 may be formed as a protruding portion of the pixel-defining layer 338, but the invention is not limited thereto.

Also, an emission layer 326 of the organic light-emitting device OLED is formed in the opening of the pixel-defining layer 338, and a counter electrode 327 is deposited at the top of the emission layer 326. In other words, the opening defined by the pixel-defining layer 338 may be a sub-pixel region of an individual pixel, such as a red sub-pixel, a green sub-pixel or a blue sub-pixel, and the emission layer 326 of a corresponding color is disposed or formed in the opening.

Accordingly, for example, when the mask frame assembly 100 is prepared such that a pattern hole of the pattern 121 corresponds to the emission layer 326 as a thin film to be formed, the emission layer 326 having a desired pattern may be formed by the deposition process described above with reference to FIG. 1. Also, the unit cell pattern of the mask 120 may correspond to a display region of the organic light-emitting display apparatus.

However, when a location of the pattern 121 of the mask 120 and a location at which the emission layer 326 is to be formed on the substrate 300 are slightly misaligned while forming the emission layer 326, the locations relative to each other may be adjusted by using the pattern position adjusting mechanism 140. That is, the location of the misalignment may determine the location at which a position of the pattern 121 is to be adjusted.

Figure 6A:
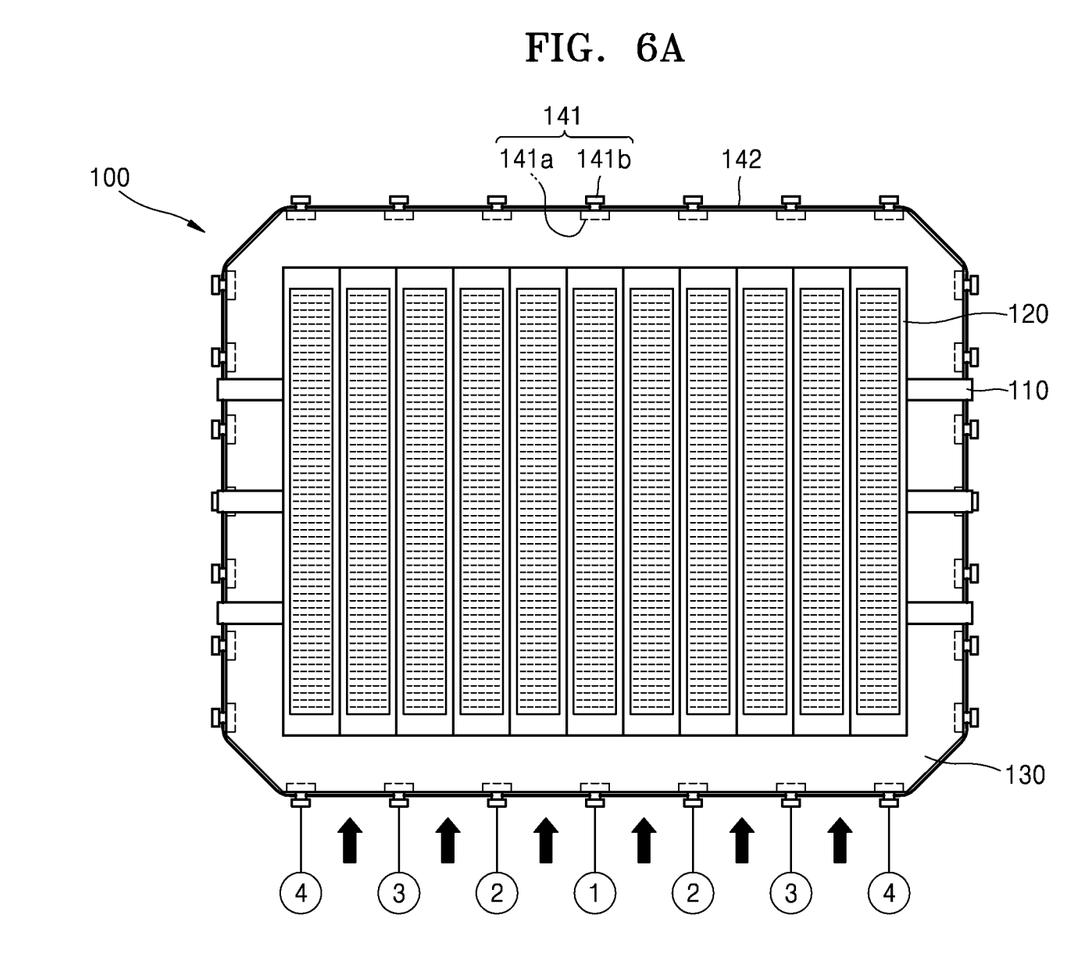
FIGS. 6A and 6B are top plan views of the mask frame assembly of FIG. 2 for describing an embodiment of a pattern position adjusting process of the mask frame assembly of FIG. 2.
Figure 6B:
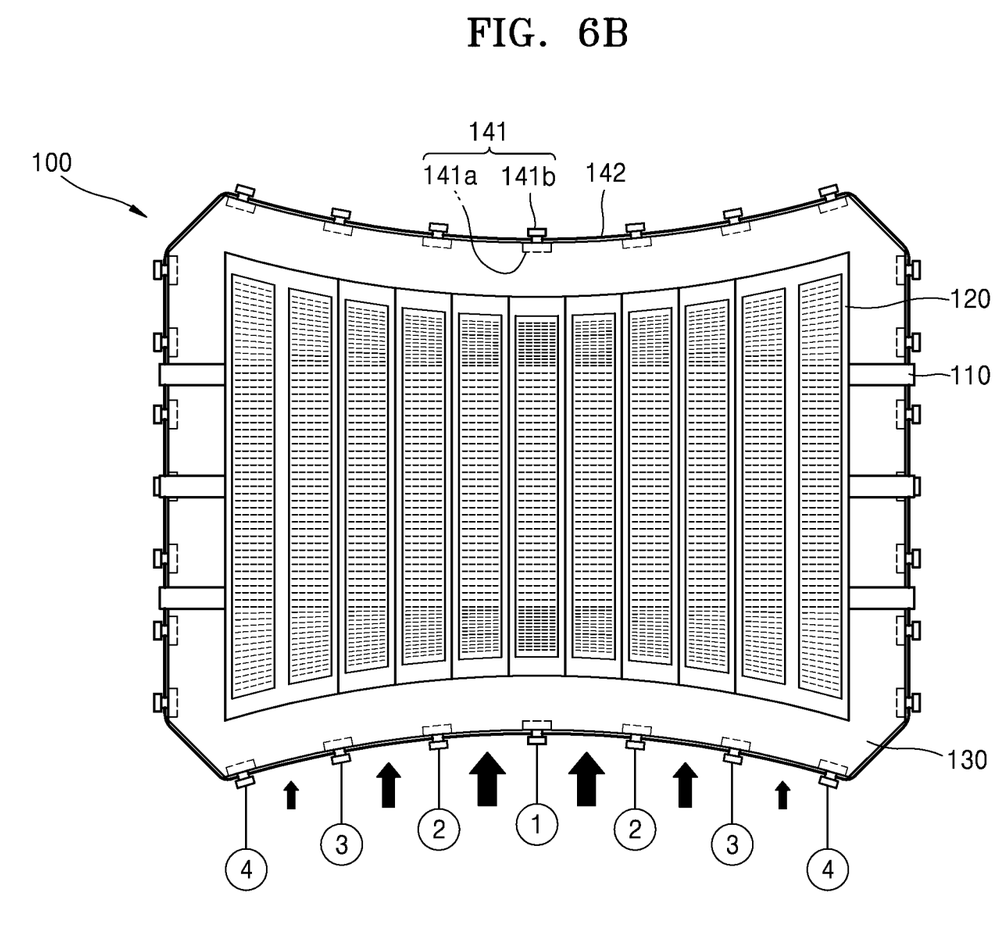

FIGS. 6A and 6B are top plan views of the mask frame assembly of FIG. 2 for describing an embodiment of a process of changing a pattern position of the mask frame assembly 100 by using the pattern position adjusting mechanism 140. FIG. 6A illustrates the mask frame assembly 100 in an initial state before a pattern position is adjusted, and FIG. 6B illustrates the mask frame assembly 100 in an adjusted state where the pattern position has been adjusted from the initial state. For convenience of understanding, a modified state of the frame 130 is exaggerated in FIG. 6B.

First, in an embodiment of a method of forming a thin film on a substrate, when adjustment is not required (e.g., a location of the pattern of the mask 120 and a location at which the thin film is to be formed on the substrate 300 are not misaligned), the mask frame assembly 100 in the initial state, in which the elongated support 110 and the mask 120 are aligned with the frame 130, is used as shown in FIG. 6A. In the views of FIGS. 6A and 6B, when the rotors 141 provided at a bottom side of the frame 130 are numbered ① through ④ based on positions of the rotors 141 relative to a center, tensions of the wire 142 between ① and ②, between ② and ③, and between ③ and ④ are uniform as shown by the same-sized arrows between adjacent rotors 141. In other words, since pattern position adjustment is not required for forming the thin film on the substrate, the mask frame assembly 100 is used in the initial state thereof without changing the tensions along the wire 142.

However, for example, when the substrate 300 is contracted and the center portion thereof becomes concave such as due to drooping of the substrate, a location of the pattern of the mask 120 and a location at which the thin film is to be formed on the substrate 300 are misaligned with each other. With such misalignment, the mask frame assembly 100 may need to be deformed accordingly as shown in FIG. 6B to adjust a pattern position and bring locations into alignment with each other. That is, the location of the misalignment may determine the location at which a position of the pattern 121 is to be adjusted.

In an embodiment of a pattern position adjusting method using the pattern position adjusting mechanism 140, the rotor 141 numbered ① is rotated in a clockwise direction (refer to FIG. 5) such that the wire 142 is further wound around the winch bolt 141a, thereby increasing tension of the wire 142 between ① and ②, e.g., tension of the wire 142 in a left and right direction of ① (refer to C in FIG. 5), compared to an initial tension state. Accordingly, the tension of the wire 142 increased between ① and ② is applied to the frame 130 as clamping force, and thus a corresponding location of the frame 130 is contracted towards the center thereof.

Also, the rotor 141 number ④ is rotated in a counter-clockwise direction (refer to FIG. 5) such that the wire 142 is unwound from the winch bolt 141a, thereby decreasing tension of the wire 142 between ③ and ④ compared to the initial tension state.

With the above actuations of the rotors, tension higher than that of the initial state is applied between ① and ② (arrows in FIG. 6B larger than those in FIG. 6A), tension equal to that of the initial state is applied between ② and ③ (arrows in FIG. 6B equal to those in FIG. 6A), and tension lower than that of the initial state is applied between ③ and ④ (arrows in FIG. 6B smaller than those in FIG. 6A). Thus, an overall tension distribution gradually decreases from ① as a peak tension at the center to each of opposing ends of the side portion of the frame 130 at ④. In addition, the clamping force applied to the frame 130 is also distributed in the same manner, and as a result the mask frame assembly 100 is deformed as shown in FIG. 6B.

Accordingly, when a location of the pattern of the mask 120 and a location at which the thin film is to be formed on the substrate 300 are misaligned with each other and a pattern position needs to be adjusted, the rotors 141 may be selectively rotated to deform the frame 130, and adjustment intensity may be further increased by adjusting the rotors 141 at the top side of the frame 130 in the same manner as the rotors 141 at the bottom side of the frame 130. The rotors 141 may be selected for rotation based on what location of the mask 12 and pattern 121 thereof is affected by the tension applied from such rotor 141 rotation.

Also, when the mask frame assembly 100 in the adjusted state shown in FIG. 6B is to be restored to the initial state shown in FIG. 6A, the above actuation of the rotors 141 may be performed in reverse. Also, sections of the frame 130 are respectively defined between adjacent rotors 141 at respective sides of the frame 130. Since tension of each of these sections may be individually adjusted by rotating the rotors 141 adjacent to each other at the section, the overall tension distribution along the frame 130 may have any one of various shapes, in addition to a shape in which the overall tension distribution gradually decreases from ① as a peak, as shown in FIG. 6B.

Referring to FIG. 4, the wire 142 that is a single monolithic wire line common to each of the rotors 141 connects all of the rotors 141 to each other. However, the invention is not limited thereto.

Figure 8:
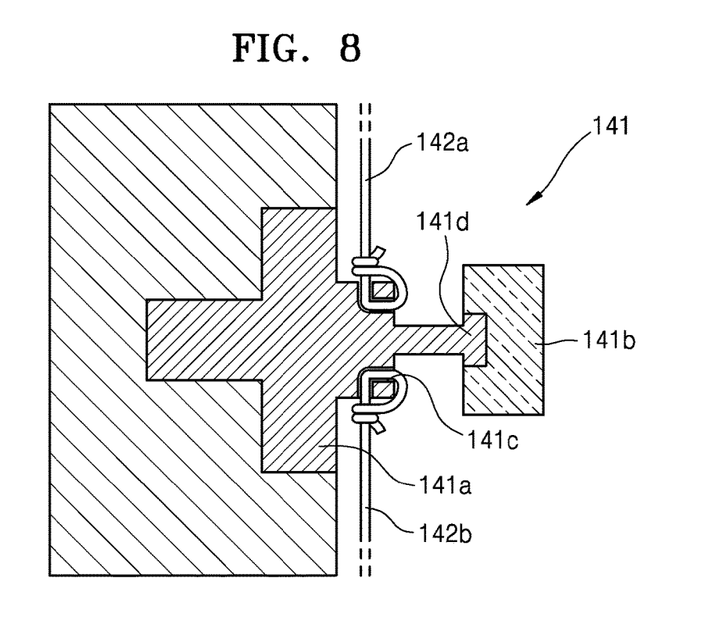
FIG. 8 is a cross-sectional view of a modified embodiment of a connection structure of a wire and a rotor in a pattern position adjusting mechanism taken along line IV-IV of FIG. 3.

As shown in FIG. 8 for a modified embodiment of a connection structure of a wire and a rotor in a pattern position adjusting mechanism, first and second wires 142a and 142b disconnected from each other respectively connect the winch bolts 141a of a group of adjacent rotors 141 to each other. The first and second wires 142a and 142b may collectively surround the outer surface of the frame 130 in a relay manner. For replacement of one of the wires 142a or 142b, only a required one of the first and second wires 142a and 142b may be replaced to reduce time and cost. As such, the length and number of wires may vary.

As shown in FIG. 8, the first end of the first wire 142a enters a through hole 141c at a first side of a first winch bolt 141a and terminates at the same through hole 141c. A second end (not shown) of the first wire 142a enters a through hole 141c at a side of a second winch bolt (not shown) and terminates at the same through hole 141c. First and second rotors 141 including the first and second winch bolts may be sequential with each other for a group of two adjacent rotors 141. Alternatively or one or more rotor 141 may be disposed between the first and second rotors 141 including the first and second winch bolts to form a group of more than two adjacent rotors 141. The above relationship of the second wire 142b to adjacent rotors 141 may be the same and repeated description thereof is omitted.

As such, according to one or more embodiment of a mask frame assembly according to the invention, since a position of a mask pattern attached to a frame may be adjusted if necessary, a deposition defect caused by deformation of the mask frame assembly or substrate may be effectively prevented. Thus, by using one or more embodiment of the mask frame assembly according to the invention, stable quality of a product for which a thin film is formed by using the mask frame assembly may be secured.

It should be understood that embodiments described herein should be considered in a descriptive sense only and not for purposes of limitation. Descriptions of features within each embodiment should typically be considered as available for other similar features in other embodiments.

While one or more embodiments have been described with reference to the figures, it will be understood by those of ordinary skill in the art that various changes in form and details may be made therein without departing from the spirit and scope as defined by the following claims.

What is claimed is:

1. A deposition pattern position adjusting method of a mask frame assembly, the deposition pattern position adjusting method comprising:
   preparing the mask frame assembly comprising:
      a mask comprising a deposition pattern through which a deposition material is deposited to a deposition target,
      a frame combined to the mask,
      a plurality of rotors combined with the frame and arranged along an edge of the frame, and
      a wire connected between two rotors among the plurality of rotors and having a tension along the edge of the frame;
   determining a location of the deposition pattern to be adjusted; and
   deforming the frame to adjust the location of the deposition pattern,
   wherein the deforming the frame comprises changing the tension of the wire by rotating a rotor, from among the two rotors, which corresponds to the location of the deposition pattern.

2. The pattern position adjusting method of claim 1, wherein each of the plurality of rotors comprises:
   a winch bolt rotatably combined to the frame and connect to the wire; and
   an adjusting bolt combined to the winch bolt, and
   the changing the tension of the wire comprises manipulation of the adjusting bolt to rotate the winch bolt connected to the wire.

3. The pattern position adjusting method of claim 2, wherein the winch bolt rotatably combined to the frame is provided on an outer surface of the edge of the frame.

4. The pattern position adjusting method of claim 2, wherein an outer circumference surface of the adjusting bolt is a polyhedron.

5. The pattern position adjusting method of claim 2, wherein the wire is provided in singularity commonly connected to all of the plurality of rotors and surrounds the edge of the frame.

6. The pattern position adjusting method of claim 2, wherein the wire connected between the at least two rotors, is provided in plurality and collectively disposed to surround the edge of the frame.

\* \* \* \* \*